United States Patent
Tchebotareva et al.

(10) Patent No.: US 12,092,939 B2
(45) Date of Patent: Sep. 17, 2024

(54) SPIN-ENTANGLED PHOTON EMISSION DEVICE

(71) Applicant: Nederlandse Organisatie voor toegepast-natuurwetenschappelijk onderzoek TNO, 's-Gravenhage (NL)

(72) Inventors: Anna Tchebotareva, Voorschoten (NL); Peter Johan Harmsma, Vleuten (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 282 days.

(21) Appl. No.: 17/784,518

(22) PCT Filed: Dec. 11, 2020

(86) PCT No.: PCT/NL2020/050779
§ 371 (c)(1),
(2) Date: Jun. 10, 2022

(87) PCT Pub. No.: WO2021/118356
PCT Pub. Date: Jun. 17, 2021

(65) Prior Publication Data
US 2023/0023493 A1  Jan. 26, 2023

(30) Foreign Application Priority Data
Dec. 11, 2019  (EP) .................................... 19215383

(51) Int. Cl.
G02F 1/21   (2006.01)
G02F 1/225  (2006.01)
H04B 10/70  (2013.01)

(52) U.S. Cl.
CPC .............. *G02F 1/213* (2021.01); *G02F 1/225* (2013.01); *H04B 10/70* (2013.01)

(58) Field of Classification Search
CPC ................................ G02F 1/213; G02F 1/225
See application file for complete search history.

(56) References Cited

U.S. PATENT DOCUMENTS

| 2008/0063015 A1* | 3/2008 | Trifonov ................. G02F 1/395 372/18 |
| 2008/0096308 A1 | 4/2008 | Santori et al. |
| 2021/0263116 A1* | 8/2021 | Bar-Gil .................. G06N 10/00 |

FOREIGN PATENT DOCUMENTS

JP       H09270569 A   * 10/1997

OTHER PUBLICATIONS

JP H09270569 A English translation (Year: 1997).*

(Continued)

*Primary Examiner* — Charlie Y Peng
(74) *Attorney, Agent, or Firm* — Leydig, Voit & Mayer, Ltd.

(57) ABSTRACT

The spin-entangled photon emission device comprises a Fabry-Pérot resonator with a solid state optical waveguide integrated on a substrate. Preferably, the device is used in a configuration that makes it possible to tune the resonance wavelength of the Fabry-Pérot resonator by straining or otherwise adjusting the effective optical length of the waveguide. A diamond membrane is located in the Fabry-Pérot resonator. The diamond membrane comprises a photon-source capable of emitting a photon that is entangled with a spin state of the photon source. A first surface of the diamond membrane abuts to a first mirror of the Fabry-Pérot resonator. The optical waveguide has a first end facet bonded to a first surface of the diamond membrane. The first mirror of the Fabry-Pérot resonator is formed by a reflector on the second surface of the diamond membrane. The second mirror of the Fabry-Pérot resonator is formed by a reflector on a second end facet of the optical waveguide or inside the optical waveguide.

16 Claims, 4 Drawing Sheets

(56) References Cited

OTHER PUBLICATIONS

European Patent Office, International Search Report in corresponding International Application No. PCT/NL2020/050779, dated Feb. 24, 2021 (3 pages).
Daniel Riedel et al., "Deterministic enhancement of coherent photon generation from a nitrogen-vacancy center in ultrapure diamond," ARXIV.ORG, Cornell University Library, 201 Olin Library Cornell University Ithaca, NY 14853, XP080753825, Mar. 2, 2017 (6 pages).
Jingyuan Linda Zhang et al., "Strongly Cavity-Enhanced Spontaneous Emission from Silicon-Vacancy Centers in Diamond," ARXIV. ORG, Cornell University Library, 201 Olin Library Cornell University Ithaca, NY 14853, XP081302010, Aug. 18, 2017 (17 pages).
Sara L. Mouradian et al., "A tunable wayeguide-coupled cavity design for scalable interfaces to solid-state quantum emitters," APL Photonics, American Institute of Physics, vol. 2, No. 4, XP012217243, pp. 046103-1 to 046103-7, (Mar. 14, 2017).
Ali W. Elshaari et al., "Strain-Tunable Quantum Integrated Photonics," Nano Lett. 18, pp. 7969-7976 (2018).
H. Bernien et al., "Heralded entanglement between solid-state qubits separated by three metres," Nature, vol. 497, pp. 86-90 (May 2, 2013).
W.B. Gao et al., "Coherent manipulation, measurement and entanglement of individual solid-state spins using optical fields," Nature Photonics, vol. 9, pp. 363-373 (Jun. 2015).
Naser Hosseini et al., "Stress-optic modulator in TriPlex platform using a piezoelectric lead zirconate titanate (PZT) thin film," published May 19, 2015, Jun. 1, 2015 | vol. 23, No. 11 | DOI:10. 1364/OE.23.014018 | Optics Express 14018 (9 pages).
Hansuek Lee et al., "Spiral resonators for on-chip laser frequency stabilization," Nature Communications, 4:2468 | DOI: 10.1038/ ncomms3468 www.nature.com/naturecommunications, pp. 1-6 (published Sep. 17, 2013).
Chris G.H. Roeloffzen, "Low-Loss Si3N4 TriPleX Optical Waveguides: Technology and Applications Overview," IEEE Journal of Selected Topics in Quantum Electronics, vol. 24, No. 4, July/Aug. 2018 (21 pages).
Suzanne B. Van Dam et al., "Optimal design of diamond-air microcavities for quantum networks using an analytical approach," New Journal of Physics, vol. 20, 2018 (14 pages).
Noel H. Wan et al., "Two-Dimensional Photonic Crystal Slab Nanocavities on Bulk Single-Crystal Diamond," Research Laboratory of Electronics, Massachusetts Institute of Technology, Cambridge, MA 02139, USA (5 pages).
Kerstin Worhoff et al., "TriPlex: a versatile dielectric photonic platform," Adv. Opt. Techn., 4(2): pp. 189-207 (2015).
Suzanne Van Dam, Thesis entitled "Optical cavities, coherent emitters, and protocols for diamond-based quantum networks," Delft University of Technology, 2019 (236 pages).
RP Photonics Consulting AG, RP Photonics Encyclopedia reference, https://www.rp-photonics.com/reference_cavities.html (4 pages).

* cited by examiner

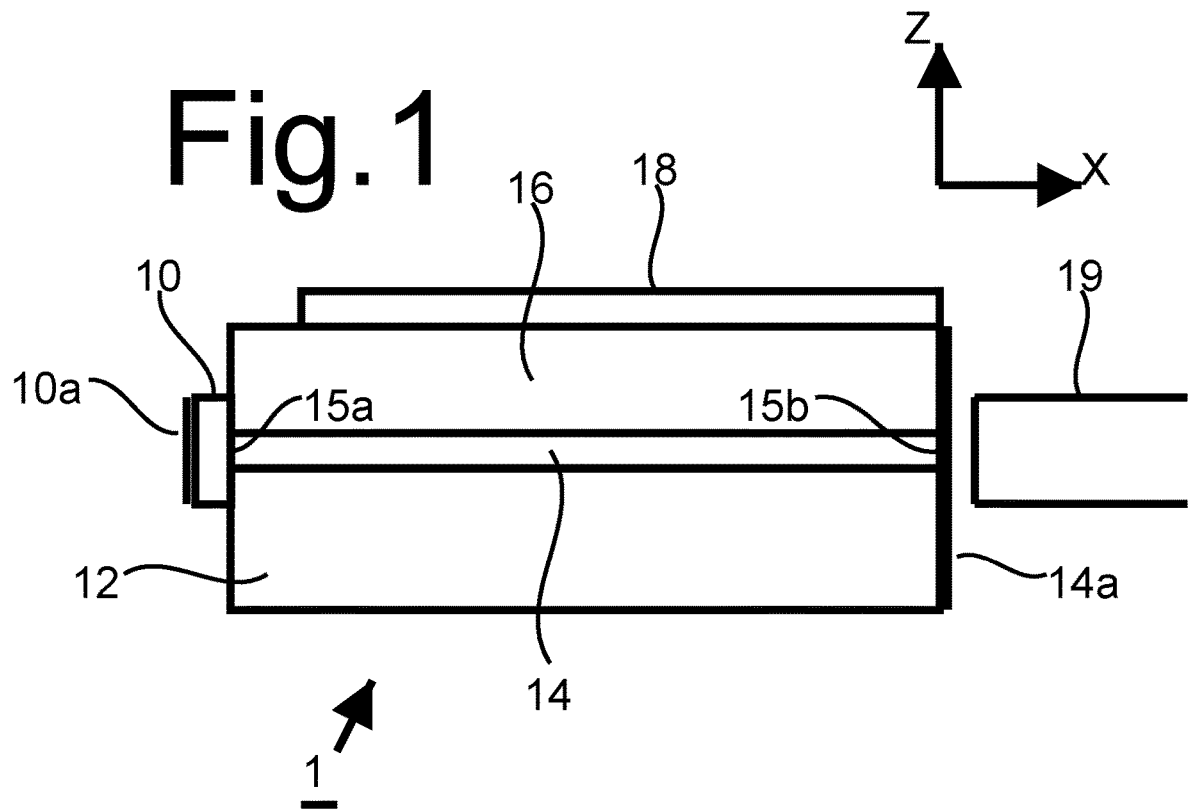
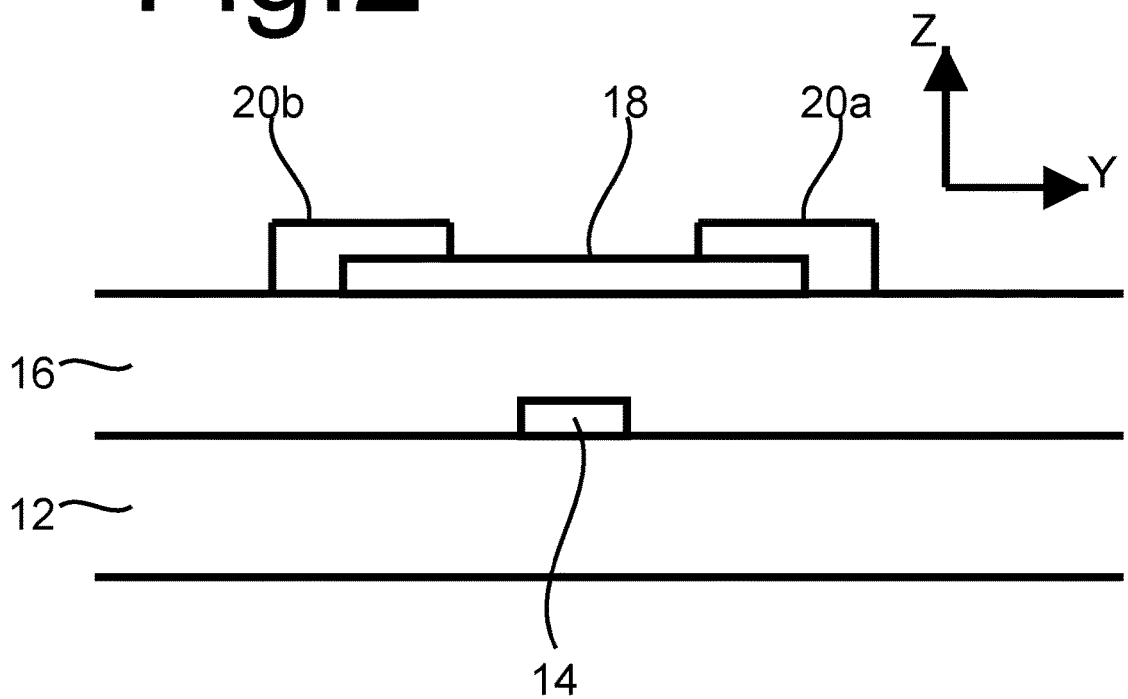

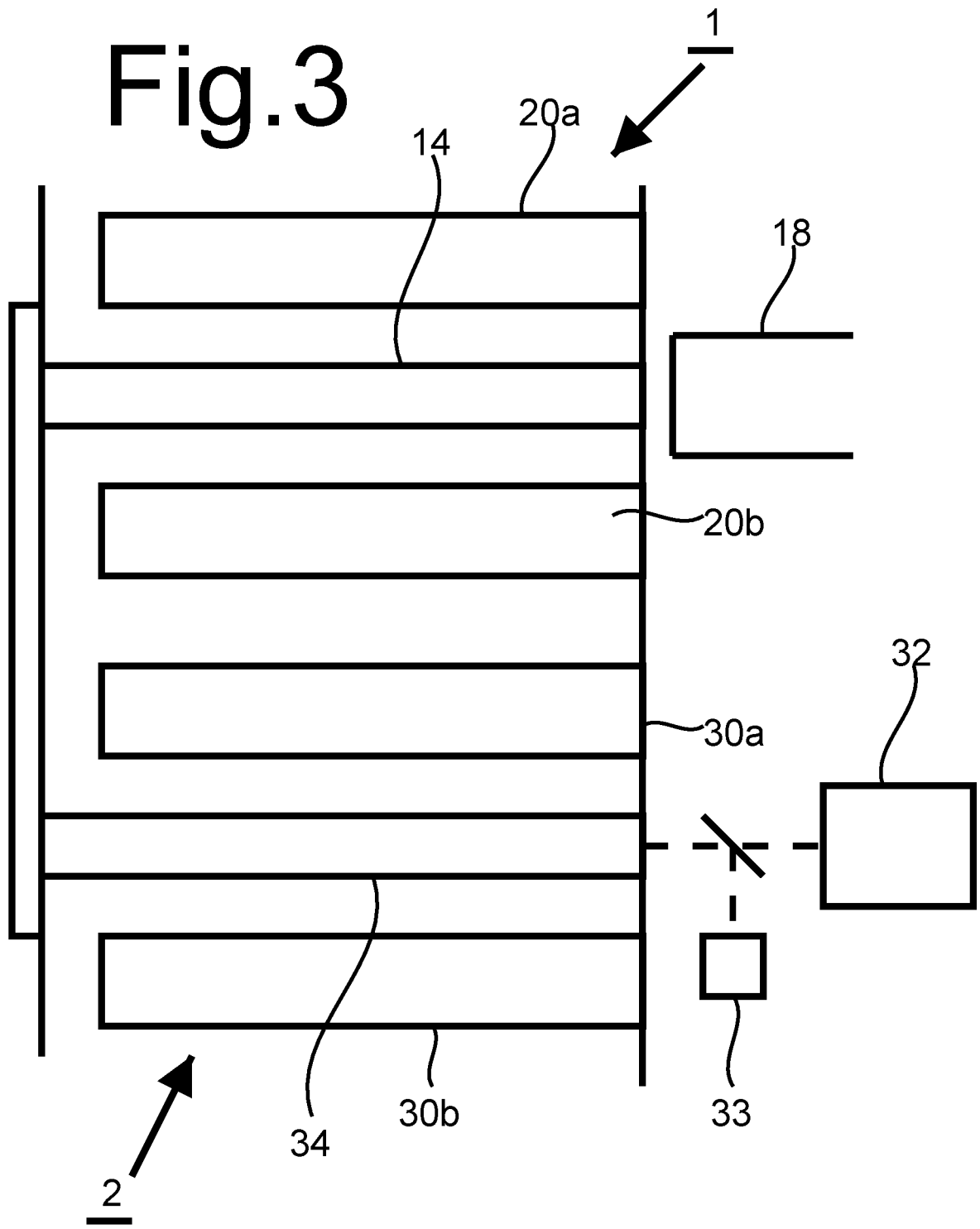

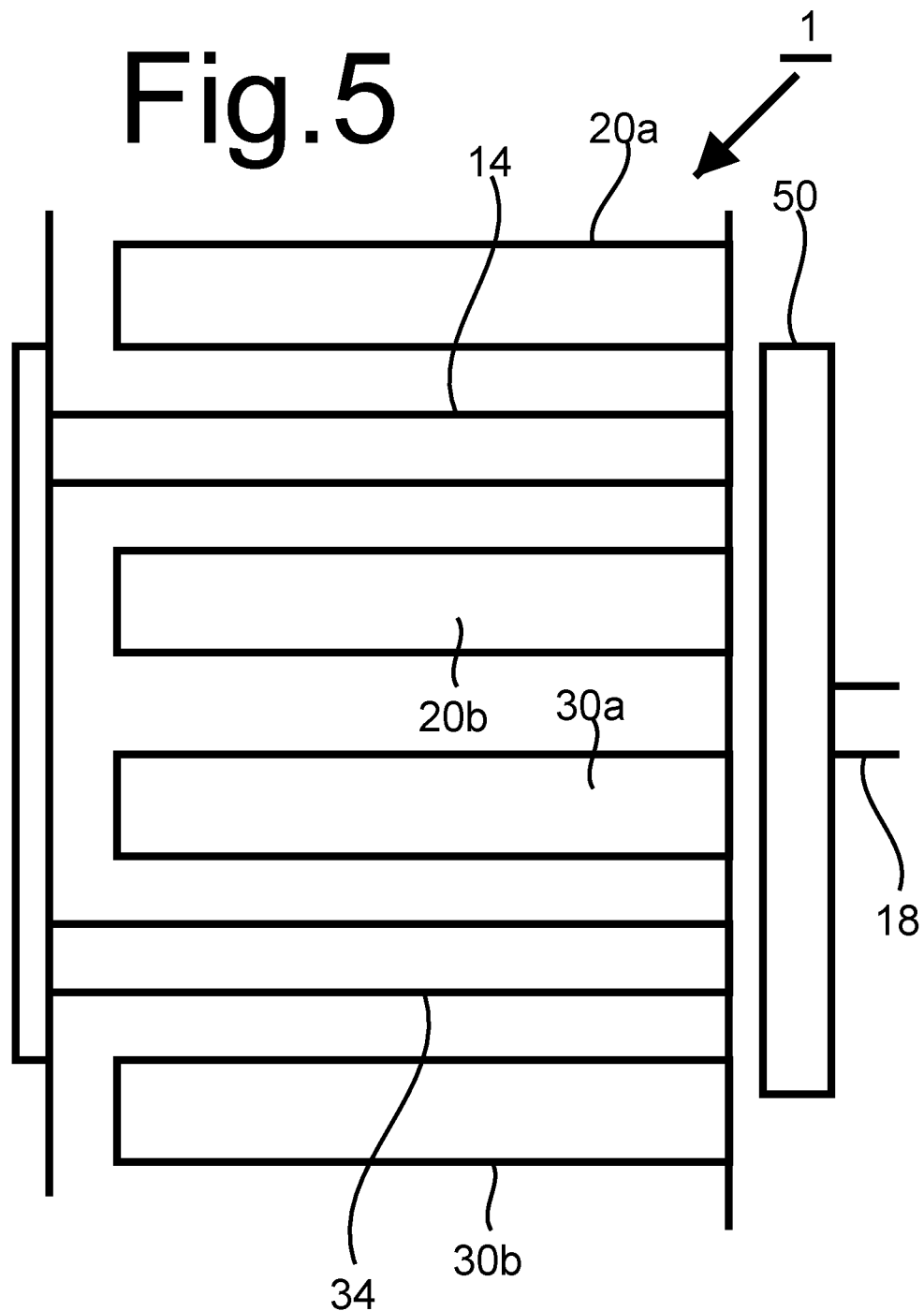

SPIN-ENTANGLED PHOTON EMISSION DEVICE

CROSS-REFERENCE TO RELATED APPLICATIONS

This patent application is a U.S. National Phase of PCT International Application No. PCT/NL2020/050779, filed Dec. 11, 2020, which claims priority to European Application No. 19215383.1, filed Dec. 11, 2019, which are both expressly incorporated by reference in their entireties, including any references contained therein.

FIELD OF THE INVENTION

The invention relates to a spin-entangled photon emission device for use in a remote entanglement quantum system.

BACKGROUND

D. Riedel et al. describe enhancement of photon emission from a defect center in a diamond membrane for use in a remote entanglement quantum network in an article titled "Deterministic Enhancement of Coherent Photon Generation from a Nitrogen-Vacancy Center in Ultrapure Diamond", published in Phys. Rev. X 7, 031040 (2017).

Riedel et al. demonstrate a device comprising a tunable Fabry-Pérot resonator, comprising a first and a second mirror facing each other, and a diamond membrane located in a space between the first and second mirror, the diamond membrane having a first and second surface facing each other, the first surface abutting to the first mirror.

The cavity is formed by a plane bottom mirror and a concave top mirror. Both bottom and top mirrors are distributed Bragg reflectors. The curved top mirror is fabricated by creating a concave depression in a silica substrate with laser ablation followed by mirror coating. The resonance frequency of the cavity mode is tuned by moving the top mirror vertically relative to the bottom mirror using Piezoelectric nano-positioners. Similarly, the lateral position of the top mirror can be tuned relative to the diamond membrane.

Riedel et al. show that placing a diamond membrane with the defect center into a Fabry-Pérot cavity increases the emission rate of the defect center by a factor (known as the Purcell factor), which can be translated into the increase of the efficiency of coherence high photon emission from the defect center in a diamond membrane. The Purcell factor is proportional to spatial and angular overlap between the defect center's optical transition dipole and the electric field in the Fabry-Pérot cavity and inversely proportional to the linewidth of the Fabry-Pérot resonance and the mode volume of the cavity.

The efficiency of such a device is analyzed further in an article by S. van Dam et al., titled "Optimal design of diamond-air micro-cavities for quantum networks using an analytical approach" published in New Journal of Physics (New J. Phys. 20 (2018) 115004. Van Dam et al. show that from a geometrical perspective, the focus in the cavity design should be on small radii of curvature of the top mirror and small air gaps. However, in the design of these cavities a high Purcell factor has to be weighed against mechanical instability of the cavity due to vibrations. Lowering the cavity finesse can be advantageous to reduce losses due to instability.

SUMMARY

Among others it is an object of the invention to provide for an increased efficiency of entangled photon emission from a photon-source that is capable of emitting a photon that is entangled with a spin state of the photon source.

A spin-entangled photon emission device is provided that comprises
   a Fabry-Pérot resonator, comprising a first and second mirror facing each other;
   a diamond membrane located in a space between the first and second mirror, the diamond membrane comprising a photon-source capable of emitting a photon that is entangled with a spin state of the photon source, the diamond membrane having a first and second surface facing each other, the first surface abutting to the first mirror;
   wherein the Fabry-Pérot resonator comprises a solid state optical waveguide integrated on a substrate, the optical waveguide having a first end facet, the first surface of the diamond membrane being bonded to the first end facet, the first mirror being formed by a reflector on the second surface of the diamond membrane and the second mirror being formed by a reflector on a second end facet of the optical waveguide or inside the optical waveguide.

Preferably, the device is used in a configuration that makes it possible to tune the resonance wavelength of the Fabry-Pérot resonator by straining or otherwise adjusting the effective optical length of the waveguide.

By using the diamond membrane to form one of the mirrors of an integrated waveguide based Fabry-Pérot interferometer, a mechanically stable high Purcell factor can be realized. The photon-source in the diamond membrane may be Nitrogen-Vacancy Center, or a vacancy center with another atom like silicon, or another defect that contains a spin and is capable of photon emission entangled with the spin-state. Preferably, the photon-source lies at a position where a maximum intensity of the light occurs as a function of position transverse to the light propagation direction in the resonator, or at least in a virtual extension of the cross-section of the waveguide. This increases the entangled photon emission rate.

In an embodiment the Fabry-Pérot interferometer is tunable. In a further embodiment the spin-entangled photon emission device comprises means for controllably straining the optical waveguide, so as to realize a tunable Fabry-Pérot interferometer. This makes it possible to tune the resonator to the photon source. In other embodiments, in order to make this possible, the waveguide may comprise a material that has an external field dependent index of refraction (e.g. electric and/or magnetic field dependent) and the device or a system that comprises the device may include a field source configured to apply this field to the waveguide.

The means for controllably straining the optical waveguide may be configured to strain the optical waveguide by exerting a controllable pressure on it, or by controllably bending the substrate, or creating a shearing force, or exerting an electromagnetic force (for example using magnetostrictive materials in the device and/or a waveguide with a magnetic field dependent index of refraction), or applying an electric field to the waveguide (for example using electrostrictive materials in the device and/or a waveguide with an electric field dependent index of refraction) or applying a pulling force to the substrate.

In an embodiment, the means for controllably straining the optical waveguide comprise
   a controllable pressure exercising layer overlying the optical waveguide;
   electrodes configured to cause the controllable pressure exercising layer to exercise a pressure on the optical waveguide directly or indirectly from at least a part of the controllable pressure exercising layer that overlies the optical waveguide. Such a controllable pressure exercising layer can be integrated over the waveguide on the same substrate as the waveguide, to exercise a controllable pressure on the waveguide in order to tune the resonator.

In an embodiment a Piezo-electric layer may be used as the controllable force exercising layer, which generates a pressure dependent on an electric field along the Piezo-electric layer generated by the voltage between the electrodes.

In other embodiments a stepper motor may be used instead of a piezo layer and the strain may be applied to the whole device (e.g. via the substrate). A tunable on-chip device may be realized by applying mechanical force in the direction of the waveguide or perpendicular to the waveguide, by simple mechanical squeezing of the whole device.

In an embodiment the optical waveguide is enclosed between the substrate and the top layer, except at the end facets of the optical waveguide, and the controllable force exercising layer lies on the top layer. This prevents a direct optical effect of the controllable force exercising layer on the optical waveguide.

In an embodiment controllable force exercising layer overlies the optical waveguide, and the electrodes lie over the top surface, extending substantially along a length direction of the optical waveguide, on opposite sides of a projection of the optical waveguide onto the top surface. In this way the tuning effect is maximized.

In an embodiment the diamond membrane is bonded to an end surface of the top layer, in a plane perpendicular to a length direction of the optical waveguide, said plane containing the first end facet. In this way a stronger mechanical connection is made possible. In a further embodiment, said plane further contains an end surface of the substrate in said plane. This further strengthens the mechanical connection.

In an embodiment the optical waveguide comprises a strip of optically transparent material with a higher index of refraction than the top layer and at least part of the substrate underneath the strip. This provides for a simple implementation of the waveguide. In further embodiment the cross-section of the strip is rectangular, but alternatively a strip with a dome shaped cross-section or a waveguide with multiple strips may be used.

In an embodiment, the device comprises one or more further Fabry-Pérot resonators comprising similar components as the optical waveguide of claim 1, wherein the first surface of the diamond membrane is bonded to the first end facet of each of the Fabry-Pérot resonators. A controllable pressure exercising layer, such as a Piezo-electric layer may be used over each of the Fabry-Pérot resonators, and electrodes may be provided to control the exerted pressure in the Fabry-Pérot resonators in a similar way. Thus two or more preferably adjacent Fabry-Pérot resonators may be provided in the same device, one of which can be used as a reference to control the tuning of all, and/or combined light from a plurality of Fabry-Pérot resonators can be used to provide a higher rate of entangled photons.

A spin-entangled photon emission system may be used comprising a device wherein means for controllably straining the optical waveguide are provided outside the integrated device, for example in the form of a deformable frame wherein the integrated device is fixed and a controllable motor configured to deform the frame and with it the integrated device, or in the form of an external electric or magnetic field source, when the waveguide is of a material that has an index of refraction which depends on such a field.

A method of emitting entangled photons is provided, using a device according to any one of the device claims, the method comprising tuning a resonance frequency of the Fabry-Pérot resonator to a photon emission frequency of the photon source. In a further embodiment, the method comprising measuring a resonance frequency of a further Fabry-Pérot resonator and controlling a voltage between the electrodes to reduce a difference between the resonance frequency of the further Fabry-Pérot resonator and a reference frequency.

BRIEF DESCRIPTION OF THE DRAWING

These and other objects and advantageous aspects will become apparent from a description of exemplary embodiments with reference to the following figures FIG. 1 shows a first cross section of a spin-entangled photon emission device FIG. 2 shows a second cross section of a spin-entangled photon emission device FIG. 3 shows a top view of a photon emission device FIG. 5 shows an embodiment with a plurality of entanglement sources

DETAILED DESCRIPTION OF EXEMPLARY EMBODIMENTS

Figure 4:
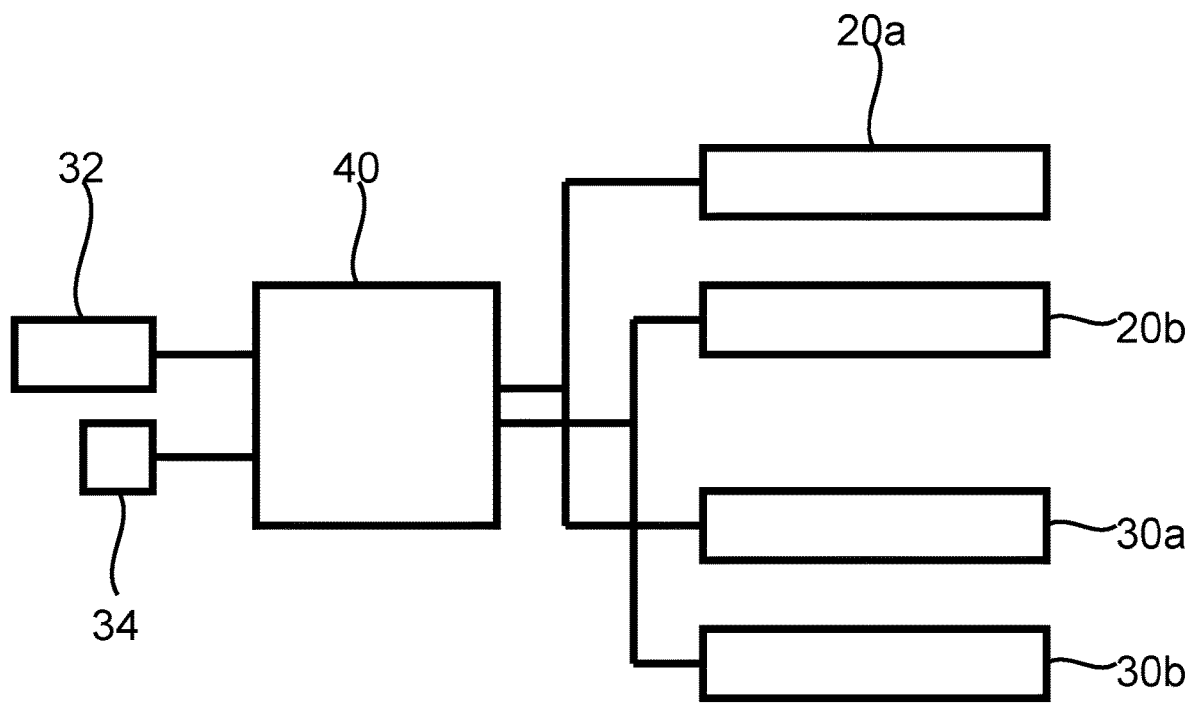
FIG. 4 shows a control circuit

FIGS. 1 and 2 show cross sections of a photon emission device (relative dimensions not to scale). The planes of cross-section are indicated as the XZ plane and the YZ plane. The device comprises a diamond membrane 10 with a local defect such as a nitrogen vacancy (NV) center, a substrate 12, an optical waveguide 14, a top layer 16, a Piezo electric layer 18 and electrodes 20*a,b*. Furthermore, an optical fiber 19 is shown.

In the illustrated embodiment, optical waveguide 14 has the form of a waveguide strip 14. Waveguide strip 14 is provided on substrate 12 and top layer 16 is provided over substrate 12 and waveguide strip 14, so that substrate 12 and top layer 16 enclose waveguide strip 14, except at first and second end facets 15*a,b* on opposite ends of the device. Substrate 12 may comprise a base substrate and a buffer layer between the base substrate and waveguide strip 14. The term substrate will be used to refer to the whole of the structure underneath waveguide strip 14. The index of refraction of waveguide strip 14 differs from that (or those) of substrate 12 (or at least a part of substrate 12 directly underneath waveguide strip) and top layer 16, so as to spatially confine the electromagnetic field of the light to waveguide strip 14, resulting in an evanescent field in substrate 12 and top layer 16. Preferably, a material with a higher index of refraction is used in waveguide strip 14 than the material(s) of the part of substrate 12 directly underneath waveguide strip and top layer 16.

In an embodiment substrate 12 and top layer 16 may be made of silicon oxide or comprise layer of silicon oxide bordering on waveguide strip 14, and waveguide strip 14 may be formed from silicon nitride for example. In an embodiment, waveguide strip 14 may be about six hundred nanometers wide and thirty nanometers high for example (in the y and z direction respectively) and waveguide strip 14 may be about two millimeter long (in the z-direction).

Although an optical waveguide in the form of a waveguide strip is used, it should be realized that waveguides of similar material with a more complex cross-section may be used. For example, the optical waveguide may comprise more than one strip, its cross-section may be dome shaped, U shaped etc. Preferably, a waveguide is used that has a single mode for both polarizations of light. However, alternatively a waveguide that support more different modes may be used, when most of the electromagnetic field is concentrated in a single mode (e.g. the fundamental mode).

Diamond membrane 10 is provided over first end facet 15a covering the end of waveguide strip 14. A first surface of diamond membrane 10 is bonded to waveguide strip 14, and optionally to substrate 12 and/or top layer 16. A defect center in diamond membrane 10 is located adjacent to the waveguide strip 14 (i.e. within a within an extension in the x of the fundamental mode of the field of waveguide strip 14). The defect center may be a Nitrogen vacancy center, but any other type of photon source that emits photons entangled with a spin state may be used. Such sources are known from the prior art. The bonding may be realized by means of Van der Waals forces, optionally with added clamping or gluing. A first reflector 10a is provided on a second surface of diamond membrane 10 in contact with the second surface of diamond membrane (the second surface of diamond membrane is its surface that is distal from first facet 15a of waveguide strip 14). In an embodiment, first reflector 10a may be created by depositing a reflective coating on second surface of diamond membrane 10, but any kind of reflector may be used. A second reflector 14a is provided over second facet 15b in contact with second facet 15b or within waveguide strip 14, e.g. in the form of a Fiber Bragg grating (FBG). In an embodiment, second reflector 14a may be created by depositing a reflective coating on second facet 15b, but any kind of reflector may be used. The reflectors may comprise a reflective coating on the second surface of diamond membrane 10 and second facet 15b, multiple coating layers etc. Instead of a second reflector 14a over second facet 15b, a reflector in waveguide strip 14 may be used, for example a distributed Bragg reflector, such as array of air gaps etched into the material of waveguide strip 4.

First reflector 10a and second reflector 14a form mirrors of a Fabry-Pérot resonator 1, wherein light travels back and forth substantially only through waveguide strip 14 and diamond membrane 10. (As used herein, the term "mirror" covers any type of reflector, and the term reflector covers a coating layer as well as more complex reflectors). At least second reflector 14a transmits a fraction of light that travels back and forth through waveguide strip 14 and diamond membrane 10. For example reflector 14a transmits no more than 2% of the light intensity from the waveguide and reflects at least 98%. First reflective coating 10a may transmit a further fraction of the light that travels back and forth through waveguide strip 14 and diamond membrane 10. Preferably, first and second reflector 10a, 14a are configured so that the further fraction is as high as feasible and at least smaller than the fraction transmitted by the second coating. Second reflector 14b at the position of waveguide strip 14, forms an output of the device. Optical fiber 19 need not be part of the device. The tip of optical fiber 19 faces second reflector 14b at the position of waveguide strip 14, so that most of the transmitted field fraction will be captured into optical fiber 19. In another embodiment, first reflector 14a at the position of waveguide strip 14 may form the output of the device, the tip of optical fiber 19 facing this output. Instead of a direct output, a further optical waveguide may be provided on the substrate, configured to collect light from one or both of the mirrors of the Fabry-Pérot interferometer, and transmit this light to an output of the device where the device may be coupled to an external optical fiber. An adiabatic coupler may be used to couple the light from optical waveguide 14 to optical fiber 19 or to the further optical waveguide, which matches the numerical apertures of optical waveguide 14 and the fiber or the further optical waveguide. For example, the geometry of the output side of optical waveguide may be configured to provide such coupling.

In optical fiber 19 photons in that fraction travel onward, e.g. to a beam splitter followed by single photon detectors (not shown) used to herald entanglement between two distant photon sources that emit photons entangled with a spin state, such as NV center spins.

As is known per se, entanglement between spin states can be generated by generating entanglement between a spin state of the photon source and a single photon emitted by the photon source, and providing for an optical path that provides for photon travel to a single photon detector. By doing the same for at least one other photon source at a different location, possible interference of the photons from the photon sources can be used to generate entanglement between the spin states in the photon sources.

The entanglement between the photon source's spin state and the photon state (here involving a field in Fabry-Pérot resonator 1) may be generated through excitation of optical transition in the photon source that depends on the spin state. Optical fiber 19 is part of the optical path to the detector. Due to the partial transmission by second reflector 10b in the photon state involves the field in both the Fabry-Pérot resonator 1 and optical fiber 19.

Because a photon source in diamond membrane 10 is located adjacent to waveguide strip 14, and hence inside a waveguide-based resonator, a high Purcell factor is realized, which results in efficient emission of photons from the photon source in diamond membrane 10. Compared to the Fabry-Pérot resonator disclosed in Riedel et al., the use of a waveguide strip concentrates the electromagnetic field into a smaller cross-section perpendicular to the direction of travel between the mirrors of the Fabry-Pérot resonator, which leads to a higher photon emission rate. Furthermore, the absence of an air gap or moving parts/reflectors for tuning of the resonance frequency of the Fabry-Pérot resonator, and the use of changing the effective optical length of the material of waveguide strip 14 instead, reduces mechanical instability, making it possible to achieve use a narrower resonance bandwidth. Both increase the rate at which entangled states can be produced.

First and second electrode 20a,b are arranged so as to provide an electric field through Piezo electric layer 18 from first electrode 20a to second electrode 20b. In addition, further conductors may be present in the device, for example a conductor may be provided adjacent to the plane that contains the end facet of optical waveguide 14, the conductor extending in parallel with that plane, so that electric current supplied through the conductor flows in parallel with that plane. Such a conductor may be used to generate a constant or time dependent magnetic field in the diamond membrane at the entangled photon source, to support spin-entangled photon emission. Use of magnetic fields to support spin-entangled photon emission is known per se. Integrating a conductor in the substrate adjacent the surface that contains the end facet of the optical waveguide, e.g. underneath the optical waveguide or over the top layer, makes it possible to generate such magnetic fields locally in a stable way.

First and second electrode 20a,b may both lie on top of part of Piezo electric layer 18 or adjacent Piezo electric layer 18, leaving at least a part of Piezo electric layer 18 above waveguide strip 14, and preferably above areas adjacent on both sides (in the y direction) from waveguide strip 14, uncovered by first and second electrode 20a,b. Piezo electric layer 18 is configured to swell or thin above waveguide strip 14 under influence of the electric field from first electrode 20a to second electrode 20b. Piezo electric layer 18 may be grown directly onto the chip surface in-situ during the fabrication process by a deposition process. Alternatively, a complete piezo element may be glued to the chip surface to provide Piezo electric layer 18.

In operation, a potential difference between first and second electrode 20a,b is used to strain waveguide strip 14 in order to tune the resonance frequency of the Fabry-Pérot resonator including waveguide strip 14 to match the emission frequency of the photon source in diamond membrane 10 adjacent to the waveguide strip 14. The resonance frequency of the Fabry-Pérot resonator depends on environmental conditions such as temperature, whereas the emission frequency of the photon source in diamond membrane 10 depends much less on such conditions than the resonance frequency of the First Fabry-Pérot resonator.

Instead of a Piezo-electric layer any other way of adjusting the effective optical length of the waveguide may be used (as is known per se, the effective optical length is proportional to the product of the physical length and the speed of light in the material or, if the speed of light varies as a function of position along the physical length, the integral of the speed of light along the physical length). To adjust the effective optical length means for controllably straining the optical waveguide may be used. This is preferably done by exerting a controllable pressure the optical waveguide, such as by means of the Piezo-electric layer. In other embodiments, the device may be used in a configuration that makes it possible to apply controllable bending to the substrate, or by creating a shearing force, or exerting an electromagnetic force (for example using magnetostrictive materials in the device and/or a waveguide with a magnetic field dependent index of refraction), or applying an electric field to the waveguide (for example using electrostrictive materials in the device and/or a waveguide with an electric field dependent index of refraction) or applying a pulling force to the substrate. In other examples, instead of a Piezo electric layer a layer is used that exercises a variable pressure due to variable thermal expansion as a result of variable thermal heating caused by a current through the material between first and second electrode 20a,b. In other alternatives, pressure may be exercised due to a variable electrostatic force created by a voltage difference between first and second electrode 20a,b, or due compression driven by a motor that is energized via first and second electrode 20a,b.

By way of example, use of tuning is described in terms of use of the Piezo-electric layer, which is the preferred way of tuning, but it should be understood that this description applies to any alternative for use of the Piezo-electric layer.

Tuning Control

To control tuning of the resonance frequency, the device comprises a means of sensing resonance conditions and a control circuit configured to control the potential difference between first and second electrode 20a,b to tune the resonance frequency of the waveguide-based Fabry-Pérot resonator to the single photon emission frequency of the photon source in the diamond membrane. Any suitable control circuit may be used, e.g. using calibration data which indicate potential differences to be generated for different values of the resonance conditions, based on characterization measurements obtained prior to use for spin-photon entanglement generation, of the potential differences required to equalize the resonance frequency of the Fabry-Pérot resonator 1 and the emission frequency of the photon source in diamond membrane 10.

FIG. 3 shows an embodiment of a photon emission device with a tunable laser 32, a detector 33, and a reference resonator. The reference resonator is provided on the same substrate and comprises an optical waveguide 14 and Piezo electric layer 18. The reference resonator comprises a further waveguide strip 34 on the substrate, a further Piezo electric layer 38 and further electrodes 30a,b. The top layer over the substrate extends over waveguide strip 14 as well as further waveguide strip 34.

In the illustrated embodiment, diamond membrane 10 extends in the Y direction to positions facing the end facet 15a of waveguide strip 14 and the end facet 35a of further waveguide strip 34. Similarly, first and second reflectors 14a,b extend to the end facets 15b, 35b of waveguide strip 14 and further waveguide strip 34. No photon source is needed in diamond membrane 10 at the positions facing the end facet 35a of further waveguide strip 34.

Further Piezo electric layer 38 is provided on top of the top layer. The geometrical configuration of Piezo electric layer 38 relative to further waveguide strip 34 is the same as the geometrical configuration of Piezo electric layer 12 relative to waveguide strip 14. First and second further electrode 30a,b are provided so as to provide an electric field through further Piezo electric layer 38, in the same way as first and second electrode 20a in relation to Piezo electric layer 18.

Tunable laser 32 is configured to supply light through a light path from tunable laser 32 to the end facet 35a of further waveguide strip 34 and from there into further waveguide strip 34. Detector 33, 32 is configured to receive light from further waveguide strip 34.

FIG. 4 shows an example of a control circuit of an embodiment of the photon emission device. In the description of FIG. 4, the previously mentioned Fabry-Pérot resonator 1 will be referred to as the first Fabry-Pérot resonator 1. The control circuit of FIG. 4 further comprises a reference resonator in the form of a second Fabry-Pérot resonator 2. It should be noted that the control circuit is merely an example and that other implementations are possible. The control circuit comprises a controller 40 with an input coupled to an output of detector 33, and outputs coupled to first and second electrode 20a,b and first and second further electrode 30a,b, as well as to a tuning control input of tunable laser 32. Controller 40 is configured to supply equal potential differences between first and second electrode 20a,b and between first and second further electrode 30a,b. Controller 40 is configured to select the potential differences so as to steer a measured resonance frequency of the second Fabry-Pérot resonator 2 to a predetermined value. In an embodiment wherein both Fabry-Pérot resonators have the same resonance frequency, the predetermined value corresponds to the emission frequency of the photon source in diamond membrane adjacent waveguide strip 14. But it suffices that the resonance frequencies of both Fabry-Pérot resonators change substantially in the same way in response to the external influences, in which case the predetermined value corresponds to the resonance frequency of the further Fabry-Pérot resonator when the resonance frequency of the Fabry-Pérot resonator 1 is at the emission frequency of the photon source in diamond membrane adjacent waveguide strip 14

Controller 40 may be configured to measure the resonance frequency of the second Fabry-Pérot resonator 2 by causing tunable laser 32 to scan the frequency of the from tunable laser 32, to read out detector 33, to detect the intensity of light from further waveguide strip 34 and to determine the measured resonance frequency from the frequency at which the detect the maximum of the intensity is detected. It should be emphasized that this is only one example of a possible measurement. For example, in another type of measurement, tunable laser 32 and detector 33 may be used to detect the peak frequency by selecting a pair of frequencies at which the detected intensities are equal and using their average as the peak frequency of the resonator. A feedback loop may be used that adjusts the average dependent on the difference between the detected intensities for the frequencies in the pair.

Any such measurement may done at least intermittently while the first Fabry-Pérot resonator 1 with waveguide strip 14 is used for generating entanglement. Thus, no direct measurements on the first Fabry-Pérot resonator 1 are needed during this generation of entanglement. The predetermined value of the resonance frequency, which corresponds to the emission frequency of the photon source in diamond membrane may be determined earlier, using measurements that directly measure on the first Fabry-Pérot resonator 1.

As illustrated in FIG. 3, a single diamond membrane 10 extends in the Y direction to positions facing the end facet 15a of waveguide strip 14 and the end facet 35a of further waveguide strip 34. This has the advantage that the first and second Fabry-Pérot resonators 1, 2 can more easily be matched. But alternatively, a first and second diamond membrane 10 may be used for the two Fabry-Pérot resonators respectively. In this case, accurate machining may provide for matching or the control circuit may be configured to apply a correction to tune the first Fabry-Pérot resonators dependent on calibration measurements on the second Fabry-Pérot resonators to account for the differences.

Plurality of Spin Photon Entanglement Sources

FIG. 5 shows an embodiment wherein a plurality of spin photon entanglement sources are provided in optically combined in parallel on the same substrate, each with a Fabry-Pérot resonator comprising an optical waveguide 14. This can be used to increase the number of spin-photon entanglement sources on the same chip, making this component of quantum networks scalable, and providing a platform for generation of many-qubit entangled states. In the illustrated embodiment, the device comprises an optical combiner 59 to supply photons from all Fabry-Pérot resonators into a single optical fiber 18. Thus the rate of production of entangled photons in optical fiber can be increased. Although two sources, each with a Fabry-Pérot resonator are shown by way of example, more may be used.

The invention claimed is:

1. A spin-entangled photon emission device comprising:
a Fabry-Pérot resonator comprising a first mirror and a second mirror facing each other; and
a diamond membrane located in a space between the first mirror and the second mirror, wherein the diamond membrane comprises a photon-source capable of emitting a photon that is entangled with a spin state of the photon source, wherein the diamond membrane has a first surface and a second surface facing each other, and wherein the first surface abuts the first mirror;
wherein the Fabry-Pérot resonator comprises a solid state optical waveguide integrated on a substrate,
wherein the solid state optical waveguide has a first end facet,
wherein the first surface of the diamond membrane is bonded to the first end facet,
wherein the first mirror is formed by a reflector on the second surface of the diamond membrane, and
wherein the second mirror is formed by a reflector located:
on a second end facet of the solid state optical waveguide, or
inside the solid state optical waveguide.

2. The spin-entangled photon emission device according to claim 1, wherein the Fabry-Pérot resonator is a tunable Fabry-Pérot resonator.

3. The spin-entangled photon emission device according to claim 2, comprising a strain source configured to controllably exert a strain on the solid state optical waveguide.

4. The spin-entangled photon emission device according to claim 3, wherein the strain source is configured to exert a controllable pressure on the solid state optical waveguide.

5. The spin-entangled photon emission device according to claim 4, wherein the strain source comprises:
a controllable pressure exercising layer overlying the solid state optical waveguide; and
electrodes configured to cause the controllable pressure exercising layer to exercise a pressure on the solid state optical waveguide directly or indirectly from at least a part, of the controllable pressure exercising layer, that overlies the solid state optical waveguide.

6. The spin-entangled photon emission device according to claim 5, wherein the controllable pressure exercising layer is a piezoelectric layer overlying the solid state optical waveguide, and
wherein the electrodes are arranged to generate an electric field along the piezoelectric layer at least in a part of the piezoelectric layer that overlies the solid state optical waveguide.

7. The spin-entangled photon emission device according to claim 5, comprising a top layer, wherein the solid state optical waveguide is enclosed between the substrate and the top layer, except at the first and second end facets of the solid state optical waveguide, and
wherein the controllable pressure exercising layer lies on the top layer.

8. The spin-entangled photon emission device according to claim 2, further comprising:
a further tunable Fabry-Pérot resonator comprising a further optical waveguide on the substrate,
wherein the further optical waveguide is enclosed between the substrate and the top layer, except at a further first end facet and a further second end facet of the further optical waveguide of the further Fabry-Pérot resonator,
wherein the first surface of the diamond membrane is bonded to the first end facet of the Fabry-Pérot resonator and the further first end facet of the further Fabry-Pérot resonator,
wherein a further first mirror of the further Fabry-Pérot resonator is formed by the reflector on the second surface of the diamond membrane,
wherein a further second mirror of the further Fabry-Pérot resonator is formed by a further reflector located:
on the further second end facet of the further optical waveguide, or
inside the further optical waveguide;
wherein the spin-entangled photon emission device comprises:
a controllable pressure exercising layer over the Fabry-Pérot resonator and the further Fabry-Pérot resonator, and electrodes configured to cause the controllable pressure exercising layer to exercise a pressure on the solid state optical waveguide and the further optical waveguide directly or indirectly from at least a part of the controllable pressure exercising layer that overlies the solid state optical waveguide and the further optical waveguide.

9. The spin-entangled photon emission device according to claim 8, comprising a detector configured to monitor a resonance frequency of the further Fabry-Pérot resonator, and a controller having an input coupled to an output of the detector, wherein the controller is configured to select a potential difference based on an output of the detector, to steer a resonance frequency of the second Fabry-Pérot resonator to a predetermined value, the controller being configured to supply the potential differences between first and second electrode and between first and second further electrode.

10. The spin-entangled photon emission device according to claim 8, comprising an optical combiner configured to combine light from the Fabry-Pérot resonator and the further Fabry-Pérot resonator.

11. The spin-entangled photon emission device according to claim 1 comprising a top layer, wherein the solid state optical waveguide is enclosed between the substrate and the top layer, except at the first and second end facets of the solid state optical waveguide,
  wherein the diamond membrane is bonded to an end surface of the top layer, in a plane perpendicular to a length direction of the solid state optical waveguide,
  wherein the plane contains the first end facet, and wherein the plane further contains an end surface of the top layer in the plane.

12. The spin-entangled photon emission device according to claim 1, wherein the diamond membrane is bonded to an end surface of the substrate, in a plane perpendicular to a length direction of the solid state optical waveguide,
  wherein the plane contains the first end facet, and
  wherein the plane further contains an end surface of the substrate in the plane.

13. The spin-entangled photon emission device claim 1 further comprising a top layer,
  wherein the solid state optical waveguide is enclosed between the substrate and the top layer, except at the first and second end facets of the solid state optical waveguide, and
  wherein the solid state optical waveguide comprises a strip of optically transparent material with a higher index of refraction than the top layer and at least part of the substrate underneath the strip of optically transparent material.

14. A spin-entangled photon emission system, comprising:
  a Fabry-Pérot resonator, comprising a first mirror and a second mirror facing each other;
  a diamond membrane located in a space between the first mirror and the second mirror, wherein the diamond membrane comprises a photon-source capable of emitting a photon that is entangled with a spin state of the photon source, wherein the diamond membrane has a first surface and second surface facing each other, and wherein the first surface abuts the first mirror;
  wherein the Fabry-Pérot resonator comprises a solid state optical waveguide integrated on a substrate,
  wherein the solid state optical waveguide has a first end facet,
  wherein the first surface of the diamond membrane is bonded to the first end facet,
  wherein the first mirror is formed by a reflector on the second surface of the diamond membrane, and
  wherein the second mirror is formed by a reflector located:
    on a second end facet of the solid state optical waveguide, or
    inside the solid state optical waveguide; and
  a strain source configured to controllably exert a strain on the solid-state optical waveguide.

15. A spin-entangled photon emission method, wherein the method comprises using a device that comprises:
  a Fabry-Pérot resonator comprising a first mirror and a second mirror facing each other; and
  a diamond membrane located in a space between the first mirror and the second mirror, wherein the diamond membrane comprises a photon-source capable of emitting a photon that is entangled with a spin state of the photon source, wherein the diamond membrane has a first surface and a second surface facing each other, and wherein the first surface abuts the first mirror;
  wherein the Fabry-Pérot resonator comprises a solid state optical waveguide integrated on a substrate,
  wherein the solid state optical waveguide has a first end facet,
  wherein the first surface of the diamond membrane is bonded to the first end facet,
  wherein the first mirror is formed by a reflector on the second surface of the diamond membrane, and
  wherein the second mirror is formed by a reflector located:
    on a second end facet of the solid state optical waveguide, or
    inside the solid state optical waveguide; and
  wherein the method comprises tuning a resonance frequency of the Fabry-Pérot resonator to a photon emission frequency of the photon source.

16. A method according to claim 15, wherein the Fabry-Pérot resonator is a tunable Fabry-Pérot resonator,
  wherein the device further comprises:
    a further tunable Fabry-Pérot resonator comprising a further optical waveguide on the substrate,
      wherein the further optical waveguide is enclosed between the substrate and the top layer, except at a further first end facet and a further second end facet of the further optical waveguide of the further Fabry-Pérot resonator,
      wherein the first surface of the diamond membrane is bonded to the first end facet of the Fabry-Pérot resonator and the further first end facet of the further Fabry-Pérot resonator,
      wherein a further first mirror of the further Fabry-Pérot resonator is formed by the reflector on the second surface of the diamond membrane,
      wherein a further second mirror of the further Fabry-Pérot resonator is formed by a further reflector located:
        on the further second end facet of the further optical waveguide, or
        inside the further optical waveguide;
    wherein the spin-entangled photon emission device comprises:
      a controllable pressure exercising layer over the Fabry-Pérot resonator and the further Fabry-Pérot resonator; and electrodes configured to cause the controllable pressure exercising layer to exercise a pressure on the solid state optical waveguide and the further optical waveguide directly or indirectly from at least a part of the controllable pressure exercising layer that overlies the solid state optical waveguide and the further optical waveguide; and wherein the method comprises measuring a resonance frequency of the further Fabry-Pérot resonator and controlling a voltage between the electrodes to reduce a difference between the resonance frequency of the further Fabry-Pérot resonator and a reference frequency.

* * * * *